(12) United States Patent
Hong et al.

(10) Patent No.: US 11,195,563 B2
(45) Date of Patent: *Dec. 7, 2021

(54) SEMICONDUCTOR APPARATUS AND SEMICONDUCTOR SYSTEM WITH TRAINING FUNCTION

(71) Applicant: SK hynix Inc., Icheon-si (KR)

(72) Inventors: Gi Moon Hong, Seoul (KR); Kyung Hoon Kim, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 85 days.

This patent is subject to a terminal disclaimer.

(21) Appl. No.: 16/412,231

(22) Filed: May 14, 2019

(65) Prior Publication Data

US 2020/0202905 A1 Jun. 25, 2020

(30) Foreign Application Priority Data

Dec. 24, 2018 (KR) ........................ 10-2018-0168405

(51) Int. Cl.
*G11C 7/10* (2006.01)
*G11C 29/02* (2006.01)
*G11C 7/22* (2006.01)

(52) U.S. Cl.
CPC .............. *G11C 7/1006* (2013.01); *G11C 7/22* (2013.01); *G11C 29/023* (2013.01); *G11C 29/024* (2013.01)

(58) Field of Classification Search
CPC .................................................... G11C 7/1006
See application file for complete search history.

(56) References Cited

U.S. PATENT DOCUMENTS

| 6,829,728 | B2 | 12/2004 | Cheng et al. |
| 7,294,998 | B2 | 11/2007 | Chiba |
| 8,683,164 | B2 | 3/2014 | Jeddeloh |
| 2003/0105999 | A1* | 6/2003 | Koss ........................ G11C 29/38 714/718 |
| 2007/0058479 | A1 | 3/2007 | Matsui |
| 2007/0234146 | A1 | 10/2007 | Watanabe et al. |
| 2008/0005493 | A1* | 1/2008 | Chung ................... G11C 7/222 711/149 |
| 2008/0244340 | A1 | 10/2008 | Doi |
| 2011/0218949 | A1 | 9/2011 | Cho et al. |
| 2013/0069678 | A1 | 3/2013 | Grosch et al. |
| 2014/0122922 | A1 | 5/2014 | Hunt et al. |
| 2016/0314821 | A1 | 10/2016 | Lu et al. |
| 2017/0154688 | A1 | 6/2017 | Kim et al. |

FOREIGN PATENT DOCUMENTS

KR 1020200078982 A 7/2020

* cited by examiner

*Primary Examiner* — Douglas King
(74) *Attorney, Agent, or Firm* — William Park & Associates Ltd.

(57) ABSTRACT

A semiconductor system includes a slave including a plurality of unit memory regions. The semiconductor system further includes a master configured to perform a training operation by writing test data to the plurality of unit memory regions, reading the written test data, and determining a pass/fail result for the read test data.

21 Claims, 4 Drawing Sheets

SEMICONDUCTOR APPARATUS AND SEMICONDUCTOR SYSTEM WITH TRAINING FUNCTION

CROSS-REFERENCES TO RELATED APPLICATION

The present application claims priority under 35 U.S.C. § 119(a) to Korean application number 10-2018-0168405, filed on Dec. 24, 2018, in the Korean Intellectual Property Office, which is incorporated herein by reference in its entirety.

BACKGROUND

1. Technical Field

Various embodiments generally relate to a semiconductor apparatus, and more particularly, to a semiconductor apparatus and semiconductor system with a training function.

2. Related Art

With the increase in operation speed of a semiconductor system, a training function is applied to check whether a signal provided from a master (for example, a memory controller, CPU or GPU) is accurately received by a slave (for example, a semiconductor memory).

The training function may include command training, write training, or/and read training, and one or more of the command training, the write training, and the read training may be selectively performed.

SUMMARY

Various embodiments are directed to a semiconductor apparatus and semiconductor system with a training function, which can reduce a training time and raise the accuracy of a training operation.

In an embodiment, a semiconductor system may include a slave including a plurality of unit memory regions. The semiconductor system may further include a master configured to perform a training operation by writing test data to the plurality of unit memory regions, reading the written test data, and determining a pass/fail result for the read test data.

In another embodiment, a semiconductor apparatus may include: a plurality of memory banks each including a plurality of memory cells; a first receiver configured to receive test data according to a reference voltage, and transmit the received test data to the plurality of memory banks; a pipe register configured to deserialize input data and output the deserialized data; a data path switching circuit configured to connect or block a path which is directly connected to the pipe register from the first receiver, according to control signals; a transmitter configured to transmit the data outputted from the pipe register to outside the semiconductor device; a second receiver configured to receive the command/address transmitted from outside the semiconductor device; and a control circuit configured to generate the control signals and the reference voltage by decoding the command/address, wherein, during a training operation, the semiconductor apparatus writes the test data to the plurality of memory banks and transmits the written test data to outside the semiconductor device, according to the control signals.

In a further embodiment, a semiconductor system may include: a slave including a plurality of unit memory regions and a pipe register for deserializing data outputted from the plurality of unit memory regions; and a master configured to perform at least one of first and second training operations, wherein the first training operation includes writing test data to the plurality of unit memory regions, reading the written test data, and determining a pass/fail result for the read test data, and the second training operation includes writing the test data to the pipe register, reading the written test data, and determining a pass/fail result for the read test data.

DETAILED DESCRIPTION

Hereinafter, a semiconductor apparatus and semiconductor system with a training function according to the present disclosure are described below with reference to the accompanying drawings through various embodiments.

Figure 1:
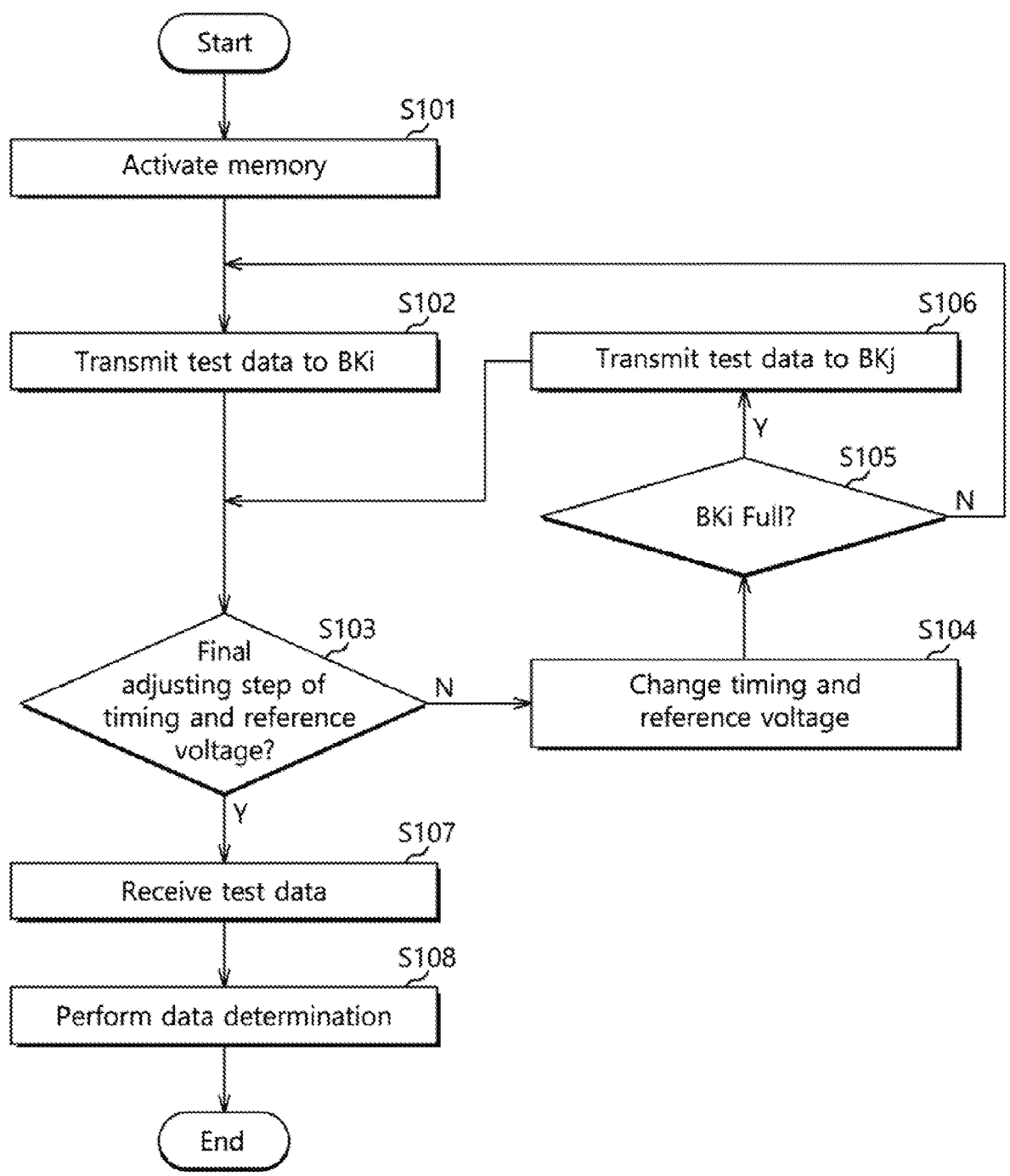
FIG. 1 illustrates a training method of a semiconductor system, in accordance with an embodiment.

FIG. 1 illustrates a training method of a semiconductor system, in accordance with an embodiment.

First, a training operation, for example, a write training operation, may be performed during an initialization period of a slave (for example, after power-up and/or initial register setup), after a refresh operation, or/and when an operation environment (temperature or voltage) variation occurs.

The training operation may be performed whenever a master (for example, a memory controller) makes a request.

As illustrated in FIG. 1, the master may provide the slave (for example, semiconductor memory) with a command (for example, an activate command) to perform a memory activation operation, at step S101.

The master may provide a command (for example, a write command) and an address, and thus transmit data, i.e. test data, to a memory bank BKi of the slave, corresponding to the address, at step S102.

At this time, the test data may include one or more data sets, and each of the one or more data sets may have patterns (bit number and form) which the master knows in advance.

The slave may store the test data transmitted by the master in the memory bank BKi.

The master may determine whether the current step is the final adjusting step of data transmission timing and reference voltage, at step S103.

When the determination result of step S103 indicates that the current step is not the final adjusting step of the data transmission timing and the reference voltage, the master may change the data transmission timing and the reference voltage, at step S104.

The master may determine whether the memory bank BKi is full or whether the memory bank BKi has spare memory cells capable of storing data therein, at step S105.

The master may know the storage capacity of the slave and usage information of each memory bank. Thus, the master may recognize whether the corresponding memory bank BKi is full, based on the test data transmitted at step S102.

When the determination result of step S105 indicates that the memory bank BKi is not full, the master may again transmit the test data to the memory bank BKi of the slave, at step S102.

When the determination result of step S105 indicates that the memory bank BKi is full, the master may transmit the test data to another memory bank BKj of the slave, at step S106. The master may then again determine whether the current step is the final adjusting step of data transmission timing and reference voltage, at S103.

When the determination result of step S103 indicates that the current step is the final adjusting step of the data transmission timing and the reference voltage, the master may provide the slave with a command (for example, a read command for reading all of the test data which the master has transmitted to the slave), and thus, the master receives all of the test data transmitted from the slave at step S107.

The master may determine a pass/fail result for all of the received data at step S108, and detect the center of a data eye according to the pass/fail determination result.

The master may know the transmission timings of the test data stored in the respective memory banks of the slave and the reference voltage which the slave uses to receive the test data.

Therefore, the master may store the transmission timing and the reference voltage, which correspond to the detected center of the data eye, and set the transmission timing and the reference voltage to reference values for a subsequent normal operation. Then, the training operation may be ended.

The transmission timing and the reference voltage, which correspond to the center of the data eye, may be stored not only in the master, but also in a mode register of the slave, and thus set to the operation reference values of the slave.

The training method in accordance with the present embodiment might not perform a training operation while varying the data transmission timing and the reference voltage by a preset range after the first training operation, but may set the data transmission timing and the reference voltage, corresponding to the center of the data eye detected during the previous training operation, to a start point to perform a training operation, thereby reducing the training time.

In the training method of the semiconductor system in accordance with the present embodiment, the master may perform a training operation by writing all test data required for a training operation to the memory region of the slave, i.e. the memory banks, reading all of the written test data, and determining a pass/fail result for the read test data.

The above-described training method of the semiconductor system in accordance with an embodiment may include writing all test data required for a training operation at once without an intermediate read process. However, this is only an example, and the training method of the semiconductor system may include dividing all of the test data required for the training operation, and repeating write and read operations. At this time, the quantity of the divided test data may be larger than the total memory capacity of a pipe register which will be described below. The process of dividing all of the test data required for the training operation and repeating write and read operations may consider a refresh operation of the semiconductor system. For example, when the time for writing all of the test data required for the training operation at once falls within a data retention time, all of the test data required for the training operation may be written at once. Otherwise, all of the test data required for the training operation may be divided, and write and read operations may be repeated.

The training method of the semiconductor system in accordance with the present embodiment has almost no limit in capacity because test data are written to a memory bank. Therefore, the training method does not need to repeat a process of writing and reading only a part of the all test data due to the capacity limit of the pipe register, determining a pass/fail result for the data, writing and reading the other part of the test data, and determining a pass/fail result for the data. Thus, the training method might not only reduce the time for training, but also directly write and read test data to and from a memory bank used for a normal operation, which makes it possible to increase the reliability of the training operation. For an embodiment, a method includes reading after writing all the data necessary for training regardless of a FIFO (first in, first out) memory depth. That is, to reduce training time in write training, writing data to a memory cell at one time, or in several times, and reading the data beyond a FIFO depth to find the center of the data eye.

Hereafter, an embodiment of a semiconductor system for implementing the training method described with reference to FIG. 1 is described with reference to FIG. 2.

Figure 2:
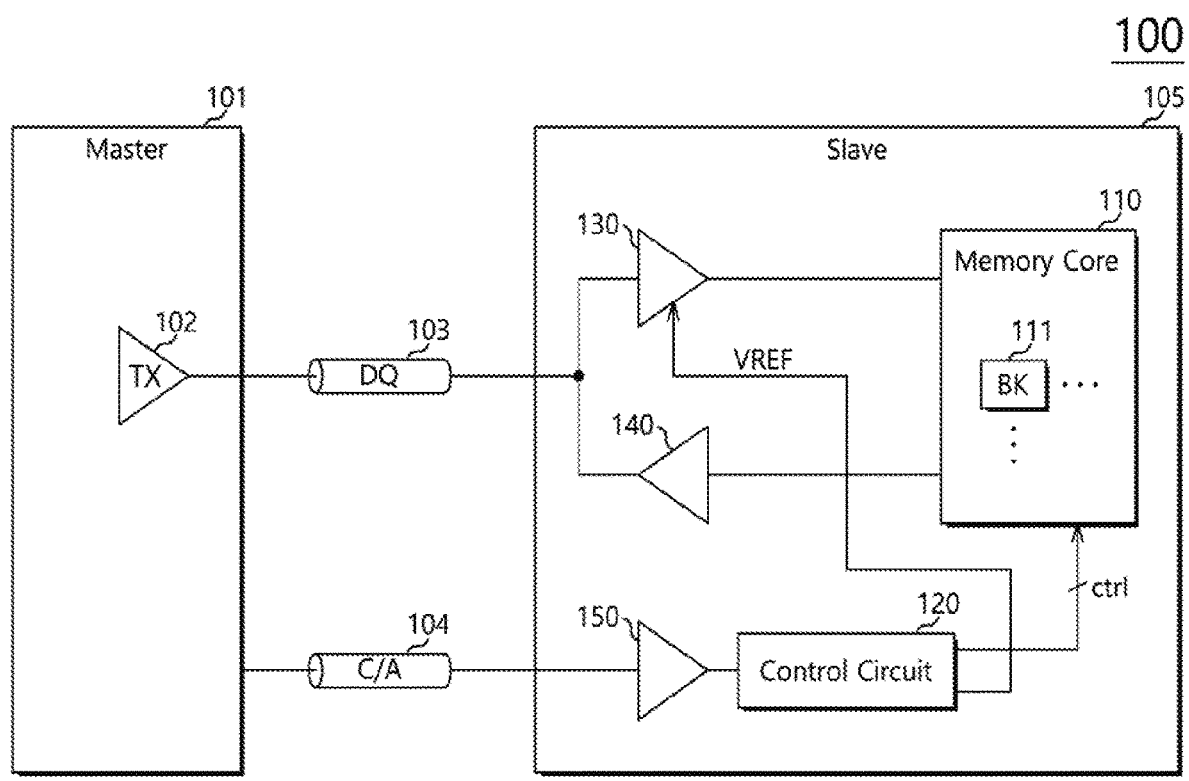
FIG. 2 illustrates a configuration of a semiconductor system, in accordance with an embodiment.

FIG. 2 illustrates a configuration of a semiconductor system 100, in accordance with an embodiment.

As illustrated in FIG. 2, the semiconductor system 100 may include a master 101 and a slave 105.

The master 101 may be configured to perform a training operation by writing test data to a plurality of unit memory regions of the slave 105, reading the written test data, and determining a pass/fail result for the read test data.

The master 101 may include a memory controller, such as a CPU or GPU, and the slave 105 may include a semiconductor memory, for example.

Between the master 101 and the slave 105, a data channel 103 and a command/address channel 104 may be coupled.

The master 101 and the slave 105 may transmit/receive data DQ through the data channel 103.

The master 101 may output test data stored for a training operation through the data channel 103.

The master 101 may transmit a command/address C/A to the slave 105 through the command/address channel 104.

The master 101 may encode a command, such as an activate, write, or read command, an address, and information for varying a reference voltage VREF into the command/address C/A.

The master 101 may encode different pieces of information into the command/address CA, depending on an operation status of the semiconductor system 100, i.e. a normal operation or training operation.

The master 101 may include control logic (not illustrated) for controlling the slave 105, in relation to the normal operation and the training operation of the slave 105.

The control logic of the master 101 may include hardware or/and software, and perform an operation of outputting the test data stored therein and an operation of generating and outputting the command/address C/A.

The master 101 may include a transmitter TX 102. The transmitter 102 may include a delay circuit capable of varying a delay time.

The master 101 may adjust data transmission timing by varying the delay time of the delay circuit of the transmitter 102.

The slave 105 may include a memory core 110, a control circuit 120, a first receiver 130, a transmitter 140, and a second receiver 150.

The first receiver 130 may receive the data DQ transmitted through the data channel 103 from the master 101 according to the reference voltage VREF, and transmit the received data to the memory core 110.

The transmitter 140 may transmit the data outputted from the memory core 110 to the master 101 through the data channel 103.

The second receiver 150 may receive the command/address C/A transmitted through the command/address channel 104 from the master 101, and transmit the received command/address C/A to the control circuit 120.

The control circuit 120 may generate the reference voltage VREF and control signals ctrl for data input/output by decoding the command/address C/A.

The memory core 110 may include a plurality of unit memory regions, i.e. a plurality of memory banks BK 111.

The memory core 110 may store the data transmitted from the first receiver 130 in the memory bank 111 according to the control signals ctrl, or read and output the data stored in the memory bank 111 according to the control signals ctrl.

Figure 3:
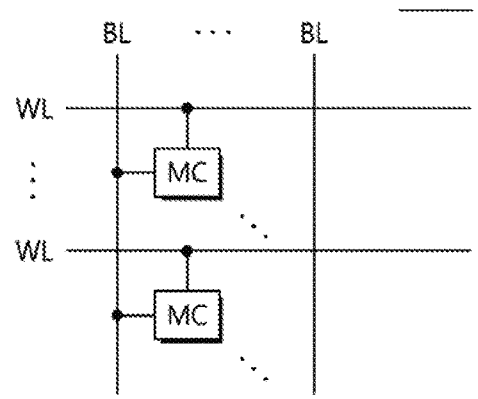
FIG. 3 illustrates a configuration of the memory bank of FIG. 2.

FIG. 3 illustrates a configuration of the memory bank of FIG. 2.

As illustrated in FIG. 3, the memory bank 111 may include a plurality of memory cells MC coupled to a plurality of word lines WL and a plurality of bit lines BL.

Figure 4:
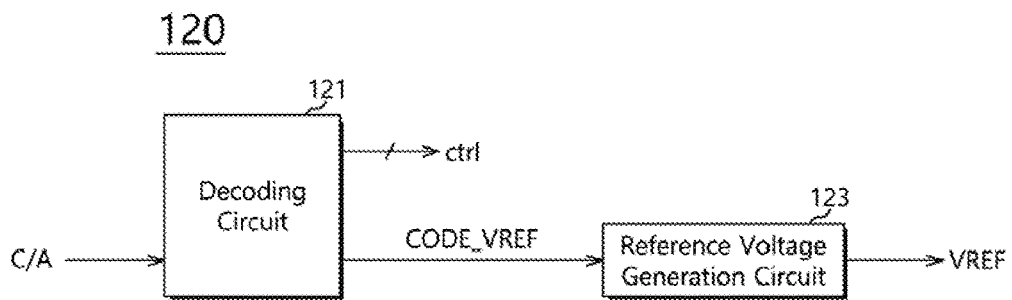
FIG. 4 illustrates a configuration of the control circuit of FIG. 2.

FIG. 4 illustrates a configuration of the control circuit of FIG. 2.

As illustrated in FIG. 4, the control circuit 120 may include a decoding circuit 121 and a reference voltage generation circuit 123.

The decoding circuit 121 may decode the command/address C/A to generate the control signals ctrl and the information for varying the reference voltage VREF, i.e. a reference voltage code signal CODE_VREF.

The decoding circuit 121 may include a plurality of decoders configured to generate the control signals ctrl and the reference voltage code signal CODE_VREF by decoding the command/address C/A.

The reference voltage generation circuit 123 may generate the reference voltage VREF based on the reference voltage code signal CODE_VREF, and the level of the reference voltage VREF may be adjusted according to the reference voltage code signal CODE_VREF.

For example, the reference voltage generation circuit 123 may include a digital-analog converter.

Figure 5:
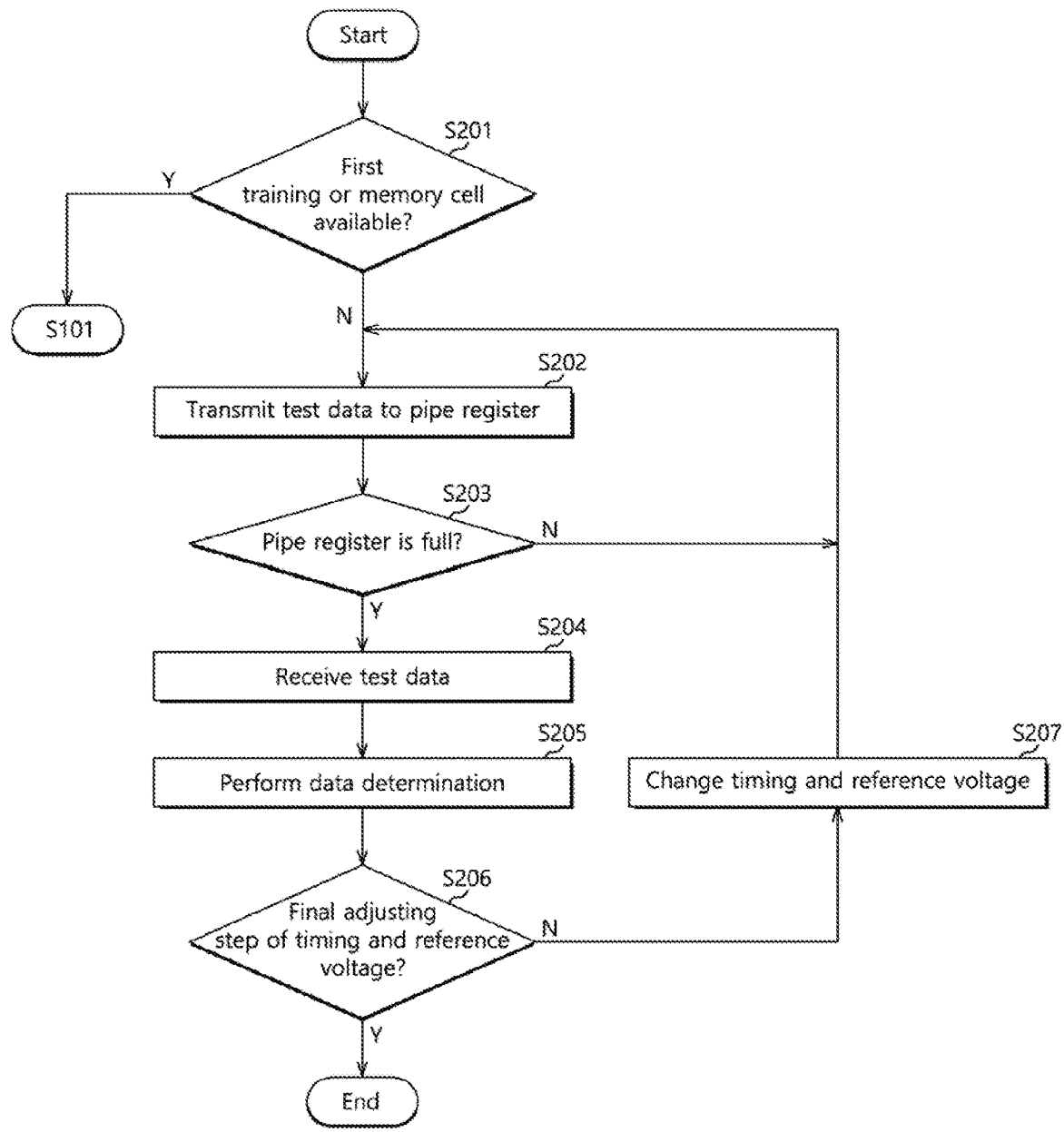
FIG. 5 illustrates a training method of a semiconductor system, in accordance with another embodiment.

FIG. 5 illustrates a training method of a semiconductor system in accordance with another embodiment.

A master may determine whether the current training operation is the first training operation or if a memory cell array can be used for the training operation, at step S201.

The operation of determining whether the current training operation is the first training operation may indicate an operation of determining whether a training operation for a corresponding slave, for example, a write training operation has never been performed before.

When the current training operation is the first training operation, it may indicate that no valid data are stored in memory cells of the salve. Thus, test data for training can be written to the memory cells of the slave.

The operation of determining whether the memory cell array can be used for the training operation may be performed to determine whether memory cells having no valid data stored therein among the memory cells, that is, spare memory cells capable of storing test data are enough to be used for training, even though the training operation for the slave has been already performed. When there are a sufficient number of spare memory cells capable of storing test data, the test data for training can be written to the spare memory cells.

When the determination result of step S201 indicates that the current training operation is the first training operation or if the memory cell array can be used for the training operation, the training operation S101 to S108 described with reference to FIG. 1 may be performed.

On the other hand, when the determination result of step S201 indicates that the current training operation is not the first training operation and there are no spare memory cells for the training operation, the master may transmit the data for training, i.e. the test data, to the pipe register of the slave at step S202.

The pipe register may be used for data deserialization in the slave. The pipe register may be used for the training operation.

The master may determine whether the pipe register is full, at step S203.

The master may know the depth and data input/output processing method of the pipe register, for example, a burst length.

Therefore, the master may know whether the pipe register is full, depending on the quantity (bit number) of the test data transmitted by the master.

When the determination result of step S203 indicates that the pipe register is not full, the master may repeat step S202.

On the other hand, when the determination result of step S203 indicates that the pipe register is full, the master may control the pipe register to output the test data stored therein, and receive the test data at step S204.

The master may determine a pass/fail result for the received test data at step S205, and detect the center of a data eye according to the pass/fail determination result.

The master may determine whether the current step is the final adjusting step of data transmission timing and reference voltage, at step S206.

When the determination result of step S206 indicates that the current step is not the final adjusting step of the data transmission timing and the reference voltage, the master may change the data transmission timing and the reference voltage at step S207.

The master may then repeat steps S202 to S207 until the determination result of step S206 indicates that the current step is the final adjusting step of the data transmission timing and the reference voltage.

When the determination result of step S206 indicates that the current step is the final adjusting step of the data transmission timing and the reference voltage, the master may store the data transmission timing and the reference voltage, corresponding to the detected center of the data eye, and set the transmission timing and the reference voltage to reference values for a subsequent normal operation. Then, the training operation may be ended.

The transmission timing and the reference voltage, which correspond to the center of the data eye, may be stored not only in the master, but also in a mode register of the slave, and thus set to the operation reference values of the slave.

The training method in accordance with the present embodiment might not perform the training operation while varying the data transmission timing and the reference voltage by a preset range after the first training operation, but set the data transmission timing and the reference voltage, corresponding to the center of the data eye detected during the previous training operation, to a start point to perform the training operation, thereby reducing the training time.

In the training method of the semiconductor system in accordance with the present embodiment, the master may perform a first training operation by writing all of the test data to the memory region of the slave, i.e. the memory banks, reading all of the written test data, and determining a pass/fail result for the read test data. Furthermore, when performing training after the first training operation, the master may perform a second training operation using the pipe register in the case that the slave has no spare memory cells capable of storing the test data required for the training.

The training method of the semiconductor system in accordance with the present embodiment may include writing all test data required for a training operation at once without an intermediate read process. However, this is only an example, and the training method of the semiconductor system may include dividing all of the test data required for the training operation, and repeating writing and reading operations. At this time, the quantity of the divided test data may be larger than the total memory capacity of the pipe register. The process of dividing all of the test data required for the training operation and repeating write and read operations may consider a refresh operation of the semiconductor system. For example, when the time for writing all of the test data required for the training operation at once falls within a data retention time, the test data required for the training operation may be written at once. Otherwise, all of the test data required for the training operation may be divided, and write and read operations may be repeated.

The training method of the semiconductor system in accordance with the present embodiment may have almost no limit in capacity because the test data are written to a memory bank. Therefore, the training method does not need to repeat a process of writing and reading only a part of the entire test data due to the capacity limit of the pipe register, determining a pass/fail result for the data, writing and reading the other part of the test data, and determining a pass/fail result for the data. Thus, the training method might not only reduce the time for training, but also directly write and read the test data to and from a memory bank used for a normal operation, which makes it possible to increase the reliability of the training operation. Furthermore, even when there are no spare memory cells, or insufficient spare memory cells, for training after the first training operation, the second training operation using the pipe register can be performed.

Hereafter, an embodiment of a semiconductor system for implementing the training method described with reference to FIG. 5 is described with reference to FIG. 6.

Figure 6:
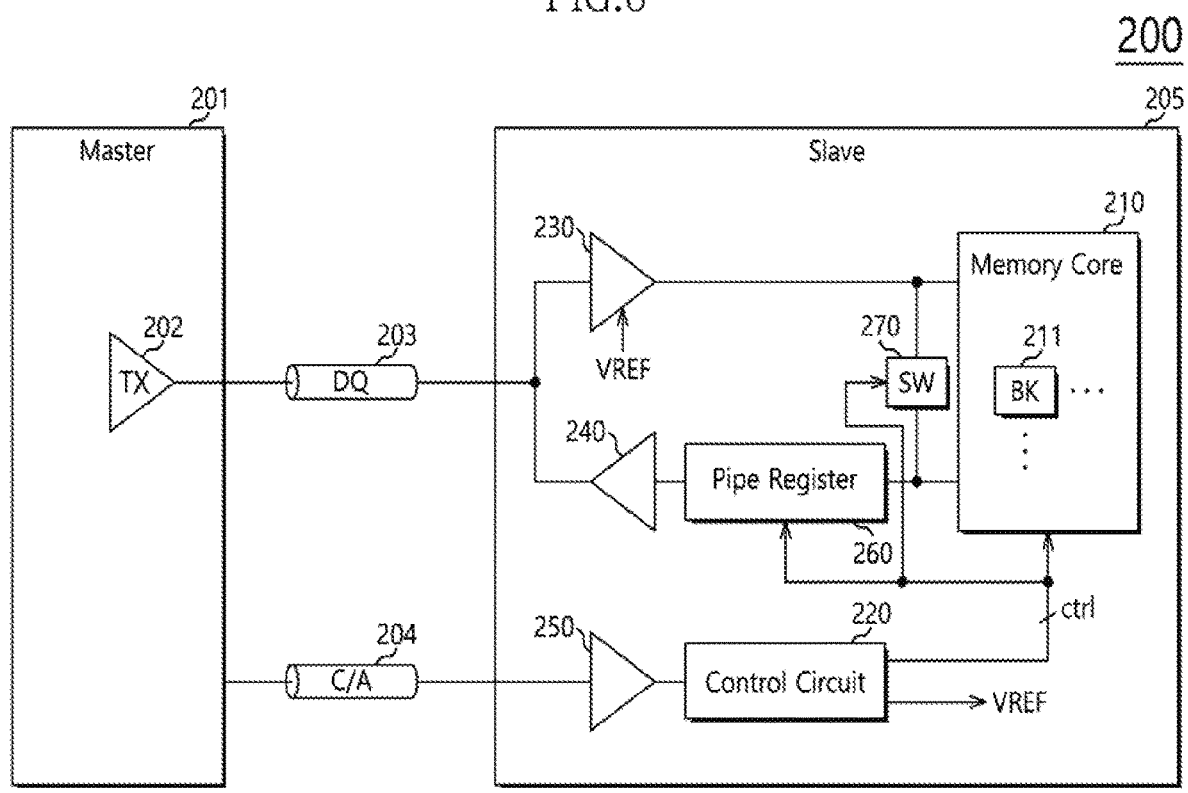
FIG. 6 illustrates a configuration of a semiconductor system, in accordance with an embodiment.

FIG. 6 illustrates a configuration of a semiconductor system 200, in accordance with another embodiment.

As illustrated in FIG. 6, the semiconductor system 200 may include a master 201 and a slave 205.

The master 201 may include a memory controller, such as a CPU or GPU, and the slave 205 may include a semiconductor memory.

Between the master 201 and the slave 205, a data channel 203 and a command/address channel 204 may be coupled.

The master 201 and the slave 205 may transmit/receive data DQ through the data channel 203.

The master 201 may transmit a command/address C/A to the slave 205 through the command/address channel 204.

The master 201 may encode a command such as an activate, write, or read command, an address, information related to training control, and information for varying a reference voltage VREF into the command/address C/A.

The master 201 may encode different pieces of information into the command/address CA depending on an operation status of the semiconductor system 200, i.e. whether the current operation is a normal operation, whether the current training operation is the first training operation, or whether there are spare memory cells for the training operation.

The master 201 may include control logic (not illustrated) for controlling the slave 205, in relation to the normal operation and the training operation of the slave 205.

The control logic of the master 201 may include hardware or/and software, and perform an operation of outputting test data stored therein and an operation of generating and outputting the command/address C/A.

The master 201 may include a transmitter TX 202. The transmitter 202 may include a delay circuit capable of delaying a delay time.

The master 201 may adjust the data transmission timing by varying the delay time of the delay circuit of the transmitter 202.

The slave 205 may include a memory core 210, a control circuit 220, a first receiver 230, a transmitter 240, a second receiver 250, a pipe register 260, and a data path switching circuit 270.

The first receiver 230 may receive data DQ transmitted through the data channel 203 from the master 201 according to the reference voltage VREF, and transmit the received data to the memory core 210.

The transmitter 240 may transmit data outputted from the pipe register 260 to the master 201 through the data channel 203.

The second receiver 250 may receive the command/address C/A transmitted through the command/address channel 204 from the master 201, and transmit the received command/address C/A to the control circuit 220.

The control circuit 220 may generate control signals ctrl and the reference voltage VREF by decoding the command/address C/A.

The memory core 210 may include a plurality of memory banks BK 211.

The memory core 210 may store the data transmitted from the first receiver 230 in the memory bank 211 according to the control signals ctrl, or read and output the data stored in the memory bank 211 according to the control signals ctrl.

The pipe register 260 may serve to deserialize the data outputted from the memory core 210, and output the deserialized data.

The pipe register 260 may deserialize the data outputted from the memory core 210 and output the deserialized data, according to the control signals ctrl.

The data path switching circuit 270 may connect or block a path which is directly connected to the pipe register 260 from the master 201, according to the control signals ctrl.

The pipe which is directly connected to the pipe register 260 from the master 201 may indicate a path which is directly connected to the pipe register 260 from the first receiver 230 without passing through the memory core 210.

During a normal operation of the semiconductor system 200, the data path switching circuit 270 may block the path which is directly connected to the pipe register 260 from the master 201, according to the control signals ctrl.

When the training operation of the semiconductor system 200 is the first training operation or there are spare memory cells capable of storing the test data for the training operation, the data path switching circuit 270 may block the path which is directly connected to the pipe register 260 from the master 201, according to the control signals ctrl.

On the other hand, when the training operation is not the first training operation and there are no spare memory cells capable of storing the test data for the training operation, the data path switching circuit 270 may connect the path which is directly connected to the pipe register 260 from the master 201, according to the control signals ctrl.

In the semiconductor system 200 in accordance with an embodiment, the transmitter 202, the data channel 203, the command/address channel 204, the first receiver 230, the transmitter 240, the second receiver 250, and the memory core 210 may be configured in the same manner as the transmitter 102, the data channel 103, the command/address channel 104, the first receiver 130, the transmitter 140, the second receiver 150, and the memory core 110 of the semiconductor system 100 described with reference to FIG. 2.

Figure 7:
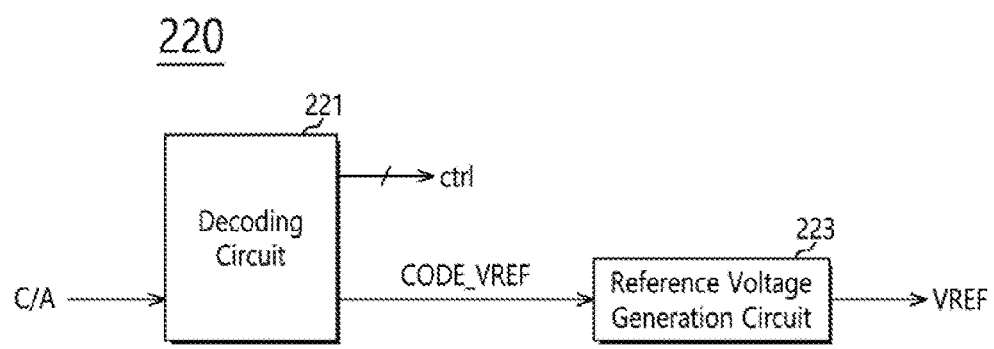
FIG. 7 illustrates a configuration of the control circuit of FIG. 6.

FIG. 7 illustrates a configuration of the control circuit 220 of FIG. 6, in accordance with an embodiment.

As illustrated in FIG. 7, the control circuit 220 may include a decoding circuit 221 and a reference voltage generation circuit 223.

The decoding circuit 221 may decode the command/address C/A to generate information for varying the reference voltage VREF, i.e. a reference voltage code signal CODE_VREF, and the control signals ctrl related to training control.

The decoding circuit 221 may include a plurality of decoders configured to generate the reference voltage code signal CODE_VREF and the control signals ctrl by decoding the command/address C/A.

The reference voltage generation circuit 223 may generate the reference voltage VREF for which the level is varied according to the reference voltage code signal CODE_VREF.

The reference voltage generation circuit 223 may include a digital-analog converter.

While various embodiments have been described above, it will be understood to those skilled in the art that the described embodiments serve as examples of a larger number of possible embodiments consistent with the present teachings. Accordingly, the operating method of a data storage device described herein should not be limited based on the described embodiments.

What is claimed is:

1. A semiconductor system comprising:
   a slave comprising a plurality of unit memory regions; and
   a master coupled to the slave through a data channel and a command/address channel, and configured to perform a training operation by writing test data to the plurality of unit memory regions, reading the written test data, and determining a pass/fail result for the read test data,
   wherein the training operation is performed by repeating detect a center of a data eye according to the pass/fail result with changing a transmission timing of the test data and store the transmission timing which correspond to a detected center of the data eye.

2. The semiconductor system according to claim 1, wherein the plurality of unit memory regions comprises a memory bank, and wherein the memory bank comprises a plurality of memory cells.

3. The semiconductor system according to claim 1, wherein the training operation is performed for at least one of:
   after power-up of the slave;
   after the power-up of the slave and after a refresh operation; and
   after the power-up of the slave, after the refresh operation, and in response to a request from the master.

4. The semiconductor system according to claim 1, wherein the master is configured to determine the pass/fail result by consecutively writing the entire test data to the plurality of unit memory regions and then reading all of the written test data.

5. The semiconductor system according to claim 1, wherein the master comprises:
   a control logic configured to output a command/address related to the training operation and the test data; and
   a transmitter configured to transmit the test data,
   wherein the transmitter comprises a delay circuit and the transmitter is configured to adjust transmission timing of the test data by varying a delay time of the delay circuit.

6. The semiconductor system according to claim 1, wherein the slave comprises:
   a first receiver configured to receive the test data according to a reference voltage and transmit the received test data to the plurality of unit memory regions;
   a transmitter configured to transmit data outputted from the plurality of unit memory regions to the master;
   a second receiver configured to receive a command/address transmitted from the master; and
   a control circuit configured to generate an internal command/address by decoding the command/address and vary the level of the reference voltage.

7. A semiconductor apparatus comprising:
   a plurality of memory banks each including a plurality of memory cells;
   a first receiver configured to receive test data according to a reference voltage and transmit the received test data to the plurality of memory banks;
   a pipe register configured to deserialize input data and output the deserialized data;
   a data path switching circuit configured to connect or block a path which is directly connected to the pipe register from the first receiver, according to control signals;
   a transmitter configured to transmit the data outputted from the pipe register to outside the semiconductor apparatus;
   a second receiver configured to receive the command/address transmitted from outside the semiconductor apparatus; and
   a control circuit configured to generate the control signals and the reference voltage by decoding the command/address,
   wherein, during a training operation, the semiconductor apparatus writes the test data to the plurality of memory banks and transmits the written test data to outside the semiconductor apparatus, according to the control signals.

8. The semiconductor apparatus according to claim 7, wherein when the training operation is the first training operation or there are spare memory cells to store the test data for the training operation, the data path switching circuit blocks the path which is directly connected to the pipe register from the first receiver, according to the control signals.

9. The memory system according to claim 7, wherein, during a normal operation, the data path switching circuit blocks the path which is directly connected to the pipe register from the first receiver, according to the control signals.

10. The semiconductor apparatus according to claim 7, wherein, when the training operation is not the first training operation or there are no spare memory cells to store the test data for the training operation, the data path switching circuit connects the path which is directly connected to the pipe register from the first receiver, according to the control signals.

11. A semiconductor system comprising:
a slave comprising a plurality of unit memory regions and a pipe register for deserializing data outputted from the plurality of unit memory regions; and
a master coupled to the slave through a data channel and a command/address channel, and configured to perform at least one of first and second training operations, wherein the first training operation comprises writing test data to the plurality of unit memory regions, reading the written test data, and determining a pass/fail result for the read test data, and the second training operation comprises writing the test data to the pipe register, reading the written test data, and determining a pass/fail result for the read test data,
wherein the at least one of first and second training operations is performed by repeating detect a center of a data eye according to the pass/fail result with changing a transmission timing of the test data and store the transmission timing which correspond to a detected center of the data eye.

12. The semiconductor system according to claim 11, wherein the plurality of unit memory regions comprises a memory bank, and wherein the memory bank comprises a plurality of memory cells.

13. The semiconductor system according to claim 11, wherein the master is configured to perform the first training operation by consecutively writing the test data to the plurality of unit memory regions and then reading the written test data.

14. The semiconductor system according to claim 11, wherein the master is configured to perform the first training operation by dividing the test data and then repeating a process of writing the divided test data to the plurality of unit memory regions and reading the written test data.

15. The semiconductor system according to claim 14, wherein a quantity of the divided test data is larger than a total memory capacity of the pipe register.

16. The semiconductor system according to claim 11, wherein the master is configured to perform the second training operation when there are no spare regions to store the test data among the plurality of unit memory regions of the salve.

17. The semiconductor system according to claim 11, wherein the master comprises:
a control logic configured to output a command/address related to at least one of the first and second training operations and the test data; and
a transmitter configured to transmit the test data,
wherein the transmitter comprises a delay circuit and the transmitter is configured to adjust transmission timing of the test data by varying a delay time of the delay circuit.

18. The semiconductor system according to claim 11, wherein the slave comprises:
a first receiver configured to receive the test data according to a reference voltage and transmit the received test data to the plurality of unit memory regions;
a data path switching circuit configured to connect or block a path which is directly connected to the pipe register from the first receiver, according to control signals;
a transmitter configured to transmit the data outputted from the pipe register to the master;
a second receiver configured to receive a command/address transmitted from the master; and
a control circuit configured to generate the control signals and the reference voltage by decoding the command/address.

19. The semiconductor system according to claim 18, wherein, during the first training operation, the data path switching circuit blocks the path which is directly connected to the pipe register from the first receiver, according to the control signals.

20. The semiconductor system according to claim 18, wherein, during a normal operation, the data path switching circuit blocks the path which is directly connected to the pipe register from the first receiver, according to the control signals.

21. The semiconductor system according to claim 18, wherein, during the second training operation, the data path switching circuit connects the path which is directly connected to the pipe register from the first receiver, according to the control signals.

\* \* \* \* \*